(12) United States Patent
Shapiro et al.

(10) Patent No.: US 6,452,454 B1
(45) Date of Patent: Sep. 17, 2002

(54) TEMPERATURE COMPENSATION MODULE

(75) Inventors: Eric Shawn Shapiro, Sherman Oaks; Shiaw Wen Chang, Thousand Oaks, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/712,771

(22) Filed: Nov. 13, 2000

(51) Int. Cl.$^7$ ................................................. H03F 3/04
(52) U.S. Cl. ........................ 330/289; 330/288; 330/296
(58) Field of Search ............................ 330/288, 289, 330/296

(56) References Cited

U.S. PATENT DOCUMENTS

| | | | |
|---|---|---|---|
| 5,672,960 A | * 9/1997 | Manaresi et al. | 323/313 |
| 6,023,185 A | * 2/2000 | Galipeau et al. | 327/513 |
| 6,052,032 A | * 4/2000 | Jarvinen | 330/289 |
| 6,297,685 B1 | * 10/2001 | Ewen et al. | 327/513 |

OTHER PUBLICATIONS

John R. Brews, The University of Arizona; Metal–Oxide–Semiconductor Field–Effect Transistor; The Electronics Handbook (1996), CRC Handbook in cooperation with IEEE Press; Section VII Semiconductor Device and Circuits, subsection 37, pp. 484 through 497 No month, 1996.

* cited by examiner

*Primary Examiner*—Robert Pascal
*Assistant Examiner*—Henry Choe
(74) *Attorney, Agent, or Firm*—Weide & Miller, Ltd.

(57) ABSTRACT

A system is disclosed for improving the operation of a circuit having one or more semiconductor devices as temperature varies over the circuit's typical range of operating temperatures. In an environment of a current mirror, the invention can be used to reduce variation in the reference current as temperature changes. This is particularly desirable at low operating voltages. In one embodiment, the invention is configured as a current compensation module connected to a current mirror regulator node. At normal temperature, the current mirror reference current and the compensation module are configured to provide the desired amount of reference current to the current mirror. At temperatures above normal, the current compensation module automatically conducts more current than at normal temperature. At temperatures below normal, the current compensation module conducts less current than at normal temperature. This manner of compensation counteracts the undesirable changes in semiconductor behavior that occur when the operating temperature of the circuit changes.

26 Claims, 9 Drawing Sheets

TEMPERATURE COMPENSATION MODULE

BACKGROUND OF THE INVENTION

1. Technical Field

This invention relates generally to amplifiers and in particular to a system for temperature compensation to improve bias circuit performance that can in turn improve amplifier performance.

2. Related Art

Historically, power amplifiers have had to meet performance specifications based on power output requirements over a temperature range. One such temperature range might be from −30 degrees C. to +85 degrees C. To meet the performance specification, the power amplifier may be required to maintain a specified degree of linear amplification throughout the operating temperature range. Linear amplification of a signal is important to achieve transmission of signals with amplitude information as well as phase information.

These temperature ranges can be problematic for power amplifiers because semiconductor devices are known to behave differently at different temperatures. For a given current bias condition, the turn-on voltage changes due to the natural behavior of a transistor over temperature ranges. Thus, maintaining linear operation over a range of temperatures challenges circuit designers because the amplifier DC bias condition also changes over a range of temperatures. Current mirror circuits are often used to control the bias conditions for a circuit with improved accuracy. During mass production, variations that occur in the current mirror also occur in the radio frequency transistors. A current mirror also provides a low impedance node to meet linearity and current capability requirements. However, at low voltages the current mirror becomes sensitive to the reference voltage.

One proposed solution to the variation in output linearity varying with temperature is to simply use a supply voltage of sufficient magnitude to insure adequate operation throughout the temperature variation. However, the trend in modern communication systems is to reduce the supply voltage. While such reductions improve certain aspects of operation, such as size, weight, and battery life, maintaining linear operation is complicated. For example, at an external regulator voltage of 3.1 volts ($V_{reference}$) a small change in the behavior of a power amplifier may change the internal regulator voltage, such as to 2.8 volts. This is sufficient enough percentage of the 3.1 volts reference voltage to adversely affect the biasing conditions in a system.

Another proposed solution to maintain linearity over a temperature range is to increase bias voltage and/or reduce the amplifier's efficiency. This will increase the linearity margin at normal conditions to meet the specification over the desired temperature range. However, this proposed solution suffers from the disadvantage of greater power usage causing shorter battery life.

Therefore, a need exists for a system to control the linearity of an amplifier's output over a range of operating temperatures. This need is increased when operating voltages decrease. This invention overcomes the disadvantages of the prior art by providing a system for semiconductor temperature compensation by decreasing the bias current variation over the operating temperature range.

SUMMARY

This invention provides a temperature compensation system for use in an amplifier system operating over a range of temperatures. Such an amplifier system may be found in typical wireless communication devices. When these wireless communication devices have circuitry configured to transmit signals their output should operate within a predefined specification over a range of varying temperatures. In particular, at higher operating temperatures, semiconductor devices draw more current. While at lower temperatures, these devices draw less current. In many applications it is desired that the semiconductor devices draw a relatively constant amount of current.

The temperature compensation system of the invention automatically adjusts the current flow into the reference node of the current mirror. This compensates for the changes in current flow in the amplifier that occur over the range of temperatures encountered by the communication device. Thus, at normal temperatures, the compensation scheme is configured to have little affect on the current flow into the amplifier device.

At low temperatures, due to the low control voltage, the current flow in an amplifier device without compensation undesirably decreases as compared to operation at normal operating temperature due to the behavior of the semiconductor devices in the bias circuit. Thus, the compensation module of the invention is configured to increase or not reduce the current flow to the amplifier device at low temperatures.

At high temperatures, due to the low control voltage, the current flow in an amplifier bias circuit without compensation undesirably increases as compared to operation at normal operating temperature. Thus, the compensation module of the invention is configured to decrease the current flow to the amplifier device at high temperatures.

In one embodiment, the temperature compensation system has one or more semiconductor devices in series with one or more resistors. In such a configuration, the number of semiconductor devices in the temperature compensation system may be greater than the number of semiconductor devices in the regulator or amplifier device. Such a ratio insures that the effect, caused by temperature, on the compensation module is greater than the effect on the regulator or amplifier device. This difference in behavior, between the compensation system and the amplifier device, insures that the compensation system adequately compensates the current flowing in the amplifier device. In other embodiments the compensation system may automatically and/or inherently react to the changes in temperature or work in unison with a temperature monitor. Likewise, the invention may be configured for use with a scheme that does not have an amplifier device.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principals of the invention. Moreover, in the figures, like reference numerals designate corresponding parts throughout the different views.

DETAILED DESCRIPTION

Normally, a current mirror is introduced into a system to decrease variation of bias conditions over a range of temperatures. The invention provides an improved system for increasing the linearity and consistency of amplifier output as temperature varies. These changes result from the dependence of the amplifier output linearity on the behavior of semiconductors, which are known to vary in operation over a temperature range. One example of a circuit affected by such variance is a current mirror. In a current mirror, a reference current is mirrored or duplicated at an output or other current path. The current mirror may optionally be configured to increase the output current by a factor N, where N is the ratio of the active area of all of the RF transistors to that of the reference transistor. N can be any number and is not necessarily limited to an integer value. In one embodiment the value N may be between 15 and 60. In a current mirror, variance in reference current over the operating temperature range influences the mirrored current by a factor N because the variation is also increased by a factor N. The term "current mirror" should be interpreted to mean any form or configuration of bias circuit, including a cascode current mirror configuration or any other circuit configured to provide bias. In one embodiment, the invention modifies the reference current as temperature changes to improve operation.

Moreover, current mirrors become more sensitive to voltages near the average regulation voltage value. In response, the invention compensates for the changes in reference current that occur over a temperature range by compensating to counter the behavior of semiconductors within the regulator and amplifier as temperature changes. Thus, at high temperatures, the compensation system draws more current from the regulator than at normal temperature thus maintaining the reference current as a more linear function over a temperature range. A reduction in reference current at high temperatures ideally counteracts the variance in reference current that results from the behavior of the semiconductors. The term low temperature and high temperatures are defined as temperatures at or near the minimum operating temperature and maximum operating temperature that the device is required to operate under specification.

Conversely, at low temperatures, the compensation system draws little to no current from the regulator as compared to the system at normal temperature. Hence, it generally does not affect the reference current. Not drawing away any reference current at low temperature ideally counteracts the variance that results from the behavior of the semiconductors at low temperatures. Practically, this compensation is not exact, but tends to decrease the variation in bias as the operating temperature changes by a sufficient amount to maintain performance specification.

Figure 1:
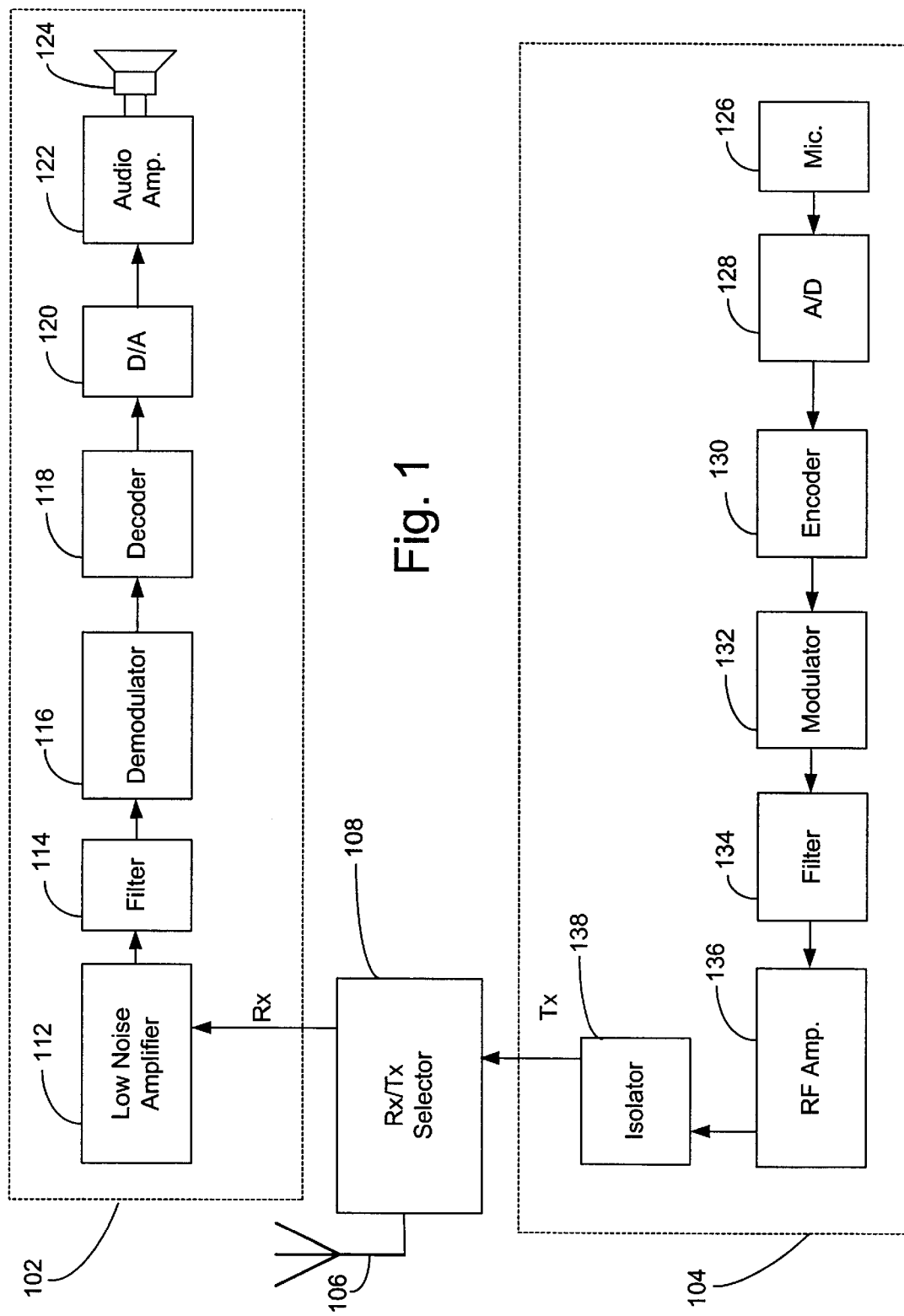
FIG. 1 is a block diagram of a receiver subsystem and a transmitter subsystem.

When used in wireless communication devices, as shown in FIG. 1, the receiver/transmitter pair comprises a receiver subsystem 102 and a transmitter subsystem 104. An antenna 106 and receiver/transmitter selector 108 are shared by the receiver subsystem 102 and the transmitter subsystem 104. The receive/transmit selector 108 allows the system to select between transmit and receive modes utilizing the receiver subsystem 102 or the transmitter subsystem 104.

In the receiver subsystem 102, a signal received from the antenna 106 is routed by the Rx/Tx selector 108 to a low noise amplifier 112. The amplifier 112 increases the power level of the incoming signal for processing by subsequent components of the receiver subsystem 102. The amplifier 112 may be configured as a low noise amplifier to reduce the introduction of additional noise on the received signal.

After amplification the signal is subject to filtering. The filter 114 may include a band pass filter configuration to eliminate noise at frequencies other than the desired frequencies. Thereafter, a demodulator 116 demodulates the signal prior to processing by the baseband module.

A decoder 118 receives the output of the demodulator 116 and reverses the effects of any encoding performed by the transmitter. Encoding may be utilized to more efficiently utilize the available bandwidth and achieve accuracy of the signal transmission. In a digital system, a digital to analog converter 120 may be used to transform the signal to an analog format. An alternative embodiment based on an analog system may omit the digital to analog converter 120. An audio amplifier 122 may be used to increase the signal strength to a level sufficient to power a speaker 124, thus allowing a user to hear voice transmission.

Also shown in FIG. 1 is the transmitter subsystem 104. The transmitter subsystem 104, when configured in a wireless communication device, such as a cellular telephone, includes a microphone 126 or other recording device capable of receiving and converting audio energy into electrical signals. An analog to digital converter 128 connects to the output of the microphone 126 and converts the signal into the digital domain for encoding by an encoder 130. The encoder 130 outputs the encoded signal to a modulator 132 for modulation to a carrier frequency. Thereafter, a filter 134 performs band pass filtering to remove any unwanted signal components from reaching a radio frequency amplifier 136. The filter 134, modulator 132 and encoder 130 are known by those of ordinary skill in the art and are therefore not described in more detail. The radio frequency amplifier 136 amplifies the modulated signal to a power level adequate to achieve transmission via the antenna 106. An isolator 138 resides between the RF amplifier 136 and the antenna 106 mainly to ensure a constant output impedance for the RF amplifier 136. In addition, the isolator 138 protects the RF amplifier 136 from damage due to having the large transmit signal reflected back into the RF amplifier 136. This type of reflection is possible if an extreme impedance, such as an open or short, is present at the antenna 106. Finally, the isolator also prevents received signals from polluting the transmitter subsystem 104.

Figure 2:
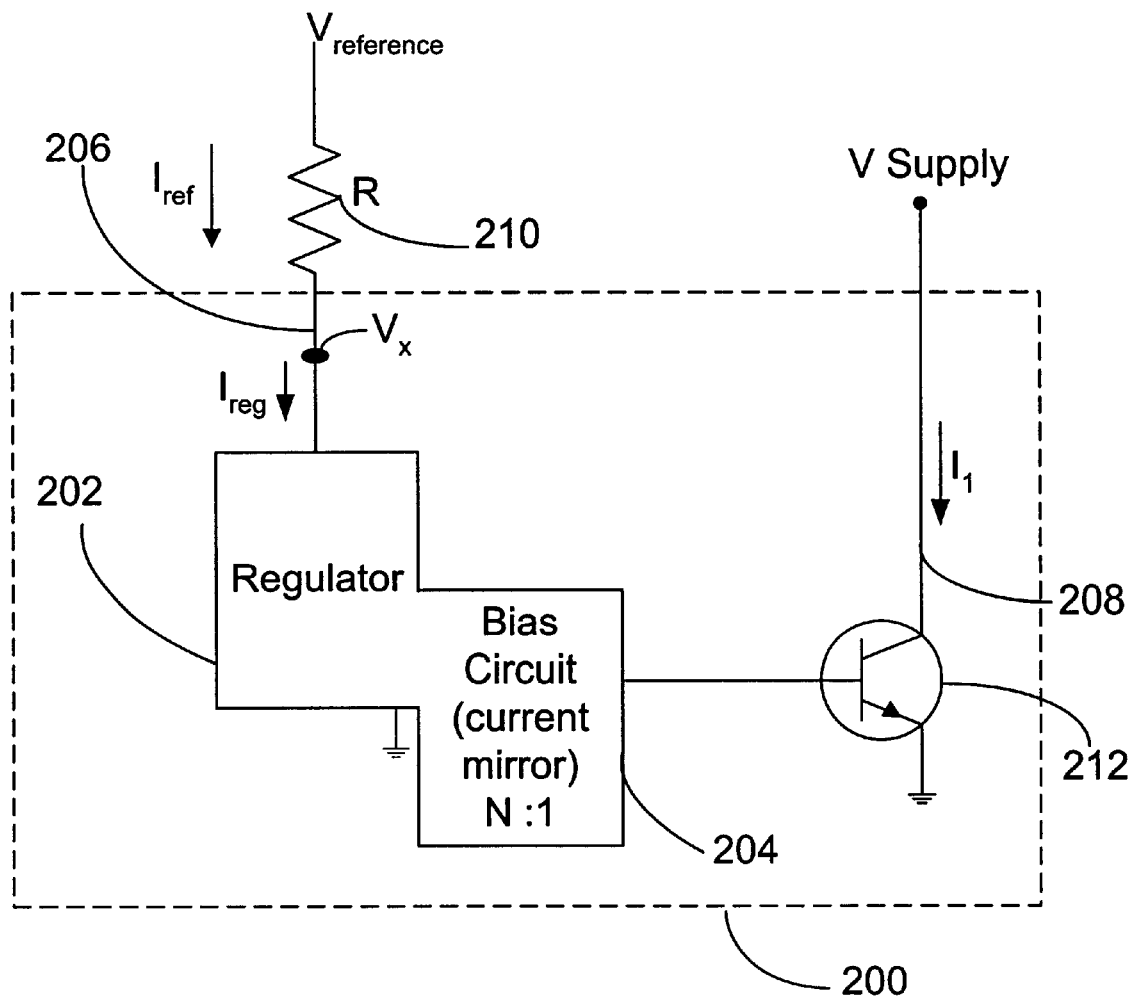
FIG. 2 is a block diagram of a bias circuit and radio frequency transistor.

FIG. 2 is a block diagram of an amplifier apparatus. As shown, a radio frequency integrated circuit 200 includes a regulator 202, a current mirror circuit 204, a bias reference node 206, and a mirrored current node 208, referred as radio frequency (RF) output 208. A current mirror is used for purposes of understanding. The term current mirror should be interpreted to mean any bias circuit.

An external resistor 210 connects to the regulator 202. The regulator and current mirror 204 are configured with interconnected devices. The RF output 208 is from a RF transistor 212 or other device as would generally be part of or connect to a current mirror 204. In another embodiment, any number of RF transistors may be connected in parallel. The current multiplication factor N is determined by the ratio of the active area of all the transistors connected in parallel to that of the reference transistor.

A voltage $V_{reference}$ and $V_X$ and a current $I_{ref}$ and $I_l$ are defined as follows and as shown in FIG. 2:

$$Iref = \frac{[Vreference - Vx]}{R}$$

In some embodiments the regulator 202 and current mirror 204 are independent.

As defined by Ohm's law, the voltage $V_X$ is defined by the voltage drop across the resistor 210 due to current $I_{ref}$.

In operation, the $V_{reference}$ is provided from a battery or other voltage source, via a voltage regulation device (not shown) to the resistor 210. The voltage across the resistor 210 creates current $I_{ref}$. The current $I_{ref}$ is mirrored to create current $I_l$ in the RF transistor 212. Current $I_l$ may optionally be increased or amplified by a factor of N. For multiplication factors where N is greater than one, the variance in $I_l$ due to $I_{ref}$ is also amplified by a factor N. Thus, as the amplification factor N increases, the undesirable variance of $I_{ref}$ due to temperature change is also magnified by a factor N. As a result, $I_l$ experiences N times the variation.

A desirable condition is to maintain control of $I_l$. However, the current $I_{ref}$ varies over temperature ranges due to changes in $V_X$. $V_X$ changes over temperature ranges due to the dependence of $V_X$ on one or more semiconductor junctions in the regulator 202 and current mirror 204 combination. As is known by those of in the art, the voltage drop, and hence current flow through a semiconductor junction varies with temperature.

As commonly occurs due to design restraints of current mirrors in low voltage systems, $V_X$ is a significant portion or percentage of $V_{reference}$. As a result, current $I_l$, being linked or mirrored to $I_{ref}$, also varies over the operating temperature range. Undesirably, the variance in $I_l$ over typical operating temperature ranges can be drastic. This impairs device operation and may limit the devices ability to meet a predetermined specification. In particular, factors such as gain, linearity (mixing and distortion), efficiency, output power capability and repeatability may all be affected by changes in temperature. The RF transistor 'class' of operation, that relates to the linearity and efficiency of a power amplifier, can be affected by a change in the RF transistor's DC bias conditions.

Figure 3:
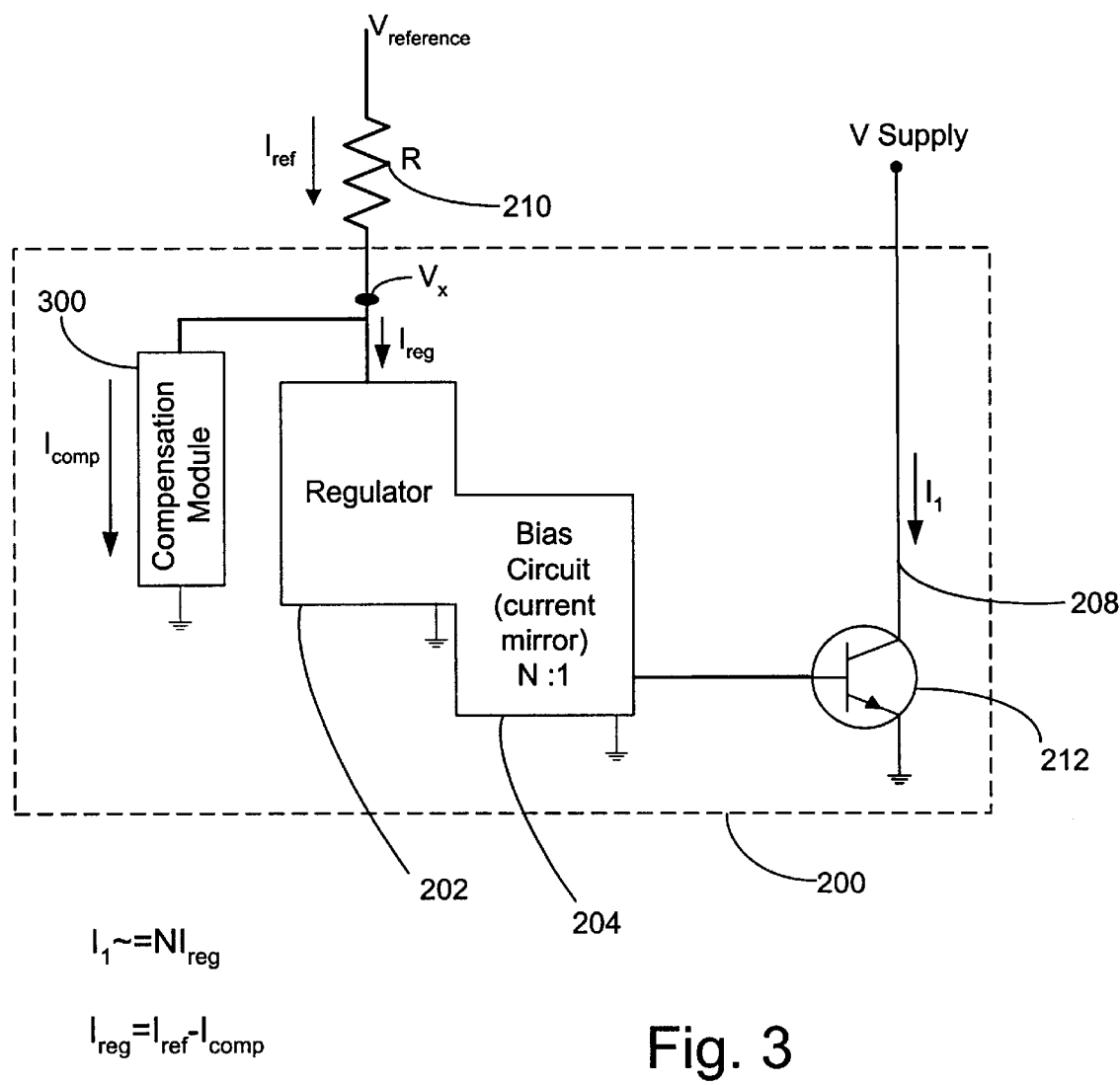
FIG. 3 is a block diagram of a bias circuit and radio frequency transistor having a temperature compensation module.

FIG. 3 illustrates a block diagram of an amplifier having a temperature compensation module 300. In this embodiment, the regulator 202 is configured in conjunction with the current mirror 204. The compensation module 300 connects to the regulator 202 or the mirror 204 in a manner to compensate for the variance in reference current in the regulator and current mirror combination that occurs over a temperature range. It is contemplated that the compensation module 300 may comprise any configuration of active or passive devices that operate to counter act the effects of temperature change on $I_{ref}$. In one configuration this is achieved by tapping into the regulator voltage node. A current $I_{comp}$ flows through the compensation module 300.

In particular, to achieve desired operation at a normal temperature the regulator 202 and compensation module 300 are configured to provide an $I_{ref}$ that meets a predetermined specification at normal temperature. However, as temperature varies, the inclusion of the compensation module 300 counters the unwanted effects of the semiconductor junctions in the regulator 202 and current mirror 204 combination to thereby reduce the variation in regulator current $(I_{reg})$.

Figure 4:
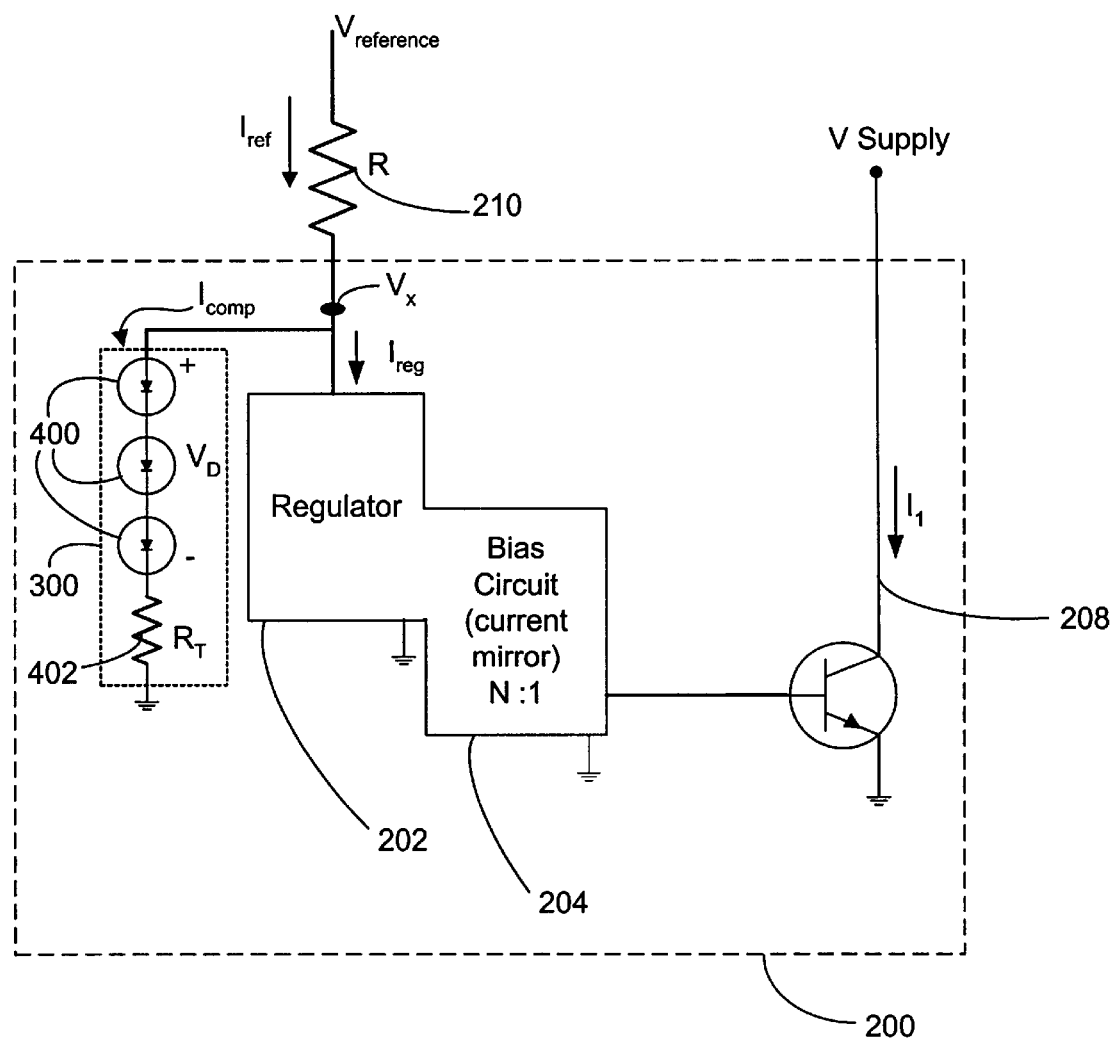
FIG. 4 is a block diagram of a bias circuit and radio frequency transistor with an example embodiment of a temperature compensation module.

FIG. 4 illustrates an example configuration of a temperature compensation module. The temperature compensation module of FIG. 4 has first, second, and third diodes 400 in a series configuration. Also in series with the first, second, and third diodes 400 is a compensation module resistor 402. Since a diode is a semiconductor device, it possesses a thermal constant (for gallium arsenide typically −2 mV /degree C.) that causes it to react similarly to the devices in the regulator 202 and mirror 204. Hence, the thermal constant affects the semiconductors in the regulator 202 and the current mirror 204 and the diodes 400 of the compensation module 300. The thermal impact on both the regulator 202 and the diodes 400 have a counter-balancing effect thus compensating for the otherwise undesirable reference current variation in systems of the prior art.

The embodiment shown in FIG. 4 utilizes three diodes 400 to generate non-linearity in compensation current over a temperature range. Any number of diodes or other semiconductor devices may be used and is not limited to three in number, or any collection of passive and/or active elements may be utilized to achieve the desired affects. However, it is desired that the compensation current be minimal at low temperatures and increase at high temperatures. In one embodiment, one or more of the diodes comprise Schottky diodes.

The number of diodes or other such semiconductor devices can be varied based on the particular needs of a circuit configuration. Three diodes are shown in FIG. 4 because the regulator 202 and mirror 204 pair is configured with the reference current $I_{ref}$ dependent on two semiconductor devices since $V_X$ is a function of temperature. As such, it is desirable to have an additional semiconductor device, i.e. three diodes, to insure that the compensation current affects the regulator current $(I_{reg})$. It is fully contemplated that configurations other than three series connected diodes in series connection with a resistor may be utilized to provide current compensation. Likewise, devices other than diodes may be utilized in the compensation module. Further, it is contemplated that the compensation module may assume configurations other than series connected devices. In other embodiments, the one or more diodes may be replaced with one or more other semiconductor devices.

The compensation resistor 402 is selected based on standard Ohm's law principles to control the compensation current flowing through the compensation module and to insure a voltage adequate to achieve operation of the semiconductor devices in the compensation module. Resistor 402 may also be chosen to maintain an amount of current flow through the temperature compensation module 300. In various embodiments the resistor 402 may be a fixed resistor, variable resistor or, in other embodiments, controlled by temperature to more accurately regulate the compensation current.

Figure 5:
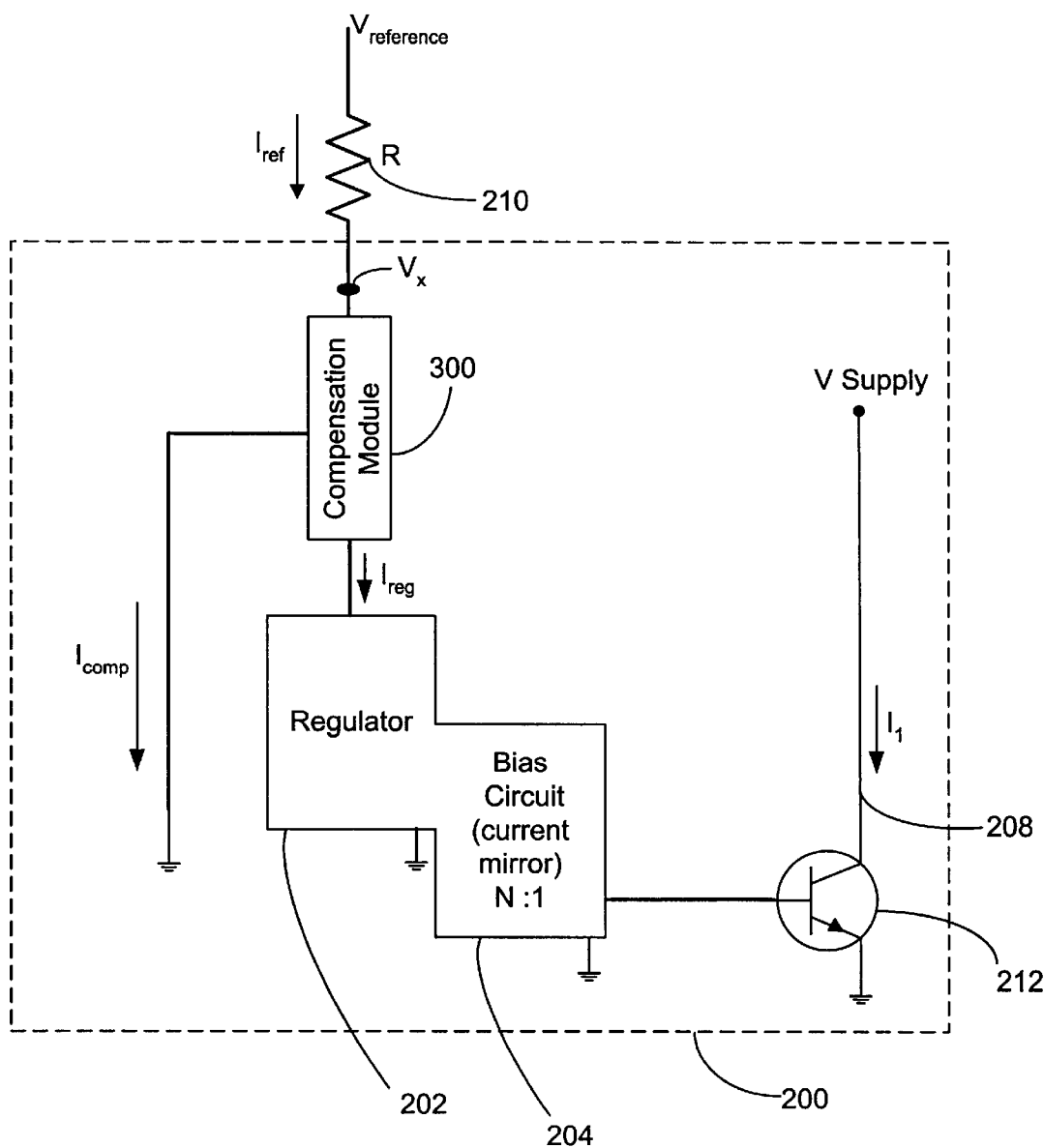
FIG. 5 is a block diagram of a bias circuit and radio frequency transistor with an alternative embodiment of a temperature compensation module.

FIG. 5 illustrates an alternative configuration of a temperature compensation module. As shown, the compensation module 300 resides in-line with the conductor between resistor 210 and the regulator 202. In this configuration, the compensation module 300 may be configured as a current dividing network to divert a desired amount of current $I_{comp}$ to ground away from the regulator 202. It is contemplated that one or more resistor be included in the compensation module 300. It is further contemplated that one or more semiconductor devices may be included in the compensation module 300.

FIGS. 6–9 illustrate the relationship between ideal current, actual current and the effects of compensation on the system. For purposes of discussion the terms actual current and ideal current when used in reference to FIGS. 6–9 refer to the reference current. It should be noted that in the embodiment of FIG. 3, the regulator current ($I_{reg}$) is related to the output current ($I_l$) by a multiplication factor N. Each of the plots in FIGS. 6–9 are made in relation to current magnitude on the vertical axis and temperature on the horizontal axis.

Figure 6:
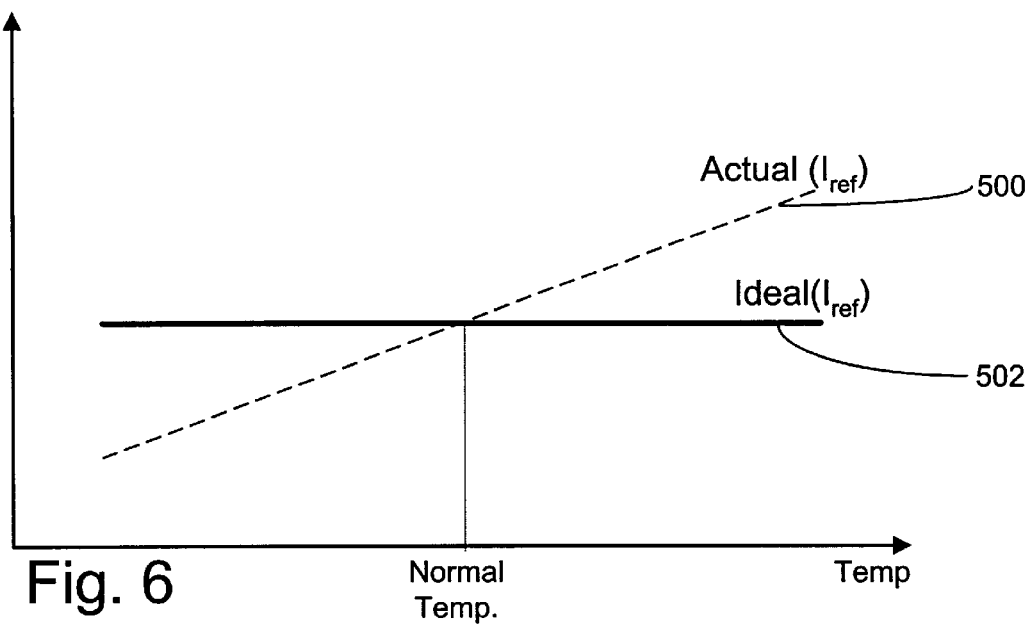
FIG. 6 illustrates an exemplary plot of ideal and actual reference current over a temperature range in the amplifier system.

FIG. 6 is a plot of an example ideal reference current 502 and the actual reference current 500 over a temperature range in an amplifier bias system without the temperature compensation module. In this example, the ideal current 502 is generally constant and linear over a temperature range. In contrast, the actual reference current 500 is generally equal in value to the ideal current 502 only at or near the mid-point referred to as normal temperature. At temperatures lower than the normal temperature, the actual current 500 is less than the ideal current 502. Conversely, at temperatures higher than the normal temperature, the actual current 500 is greater than the ideal current 502. This variance between actual current 500 and ideal current 502 is undesirable. This invention operates to reduce this variance.

Figure 7:
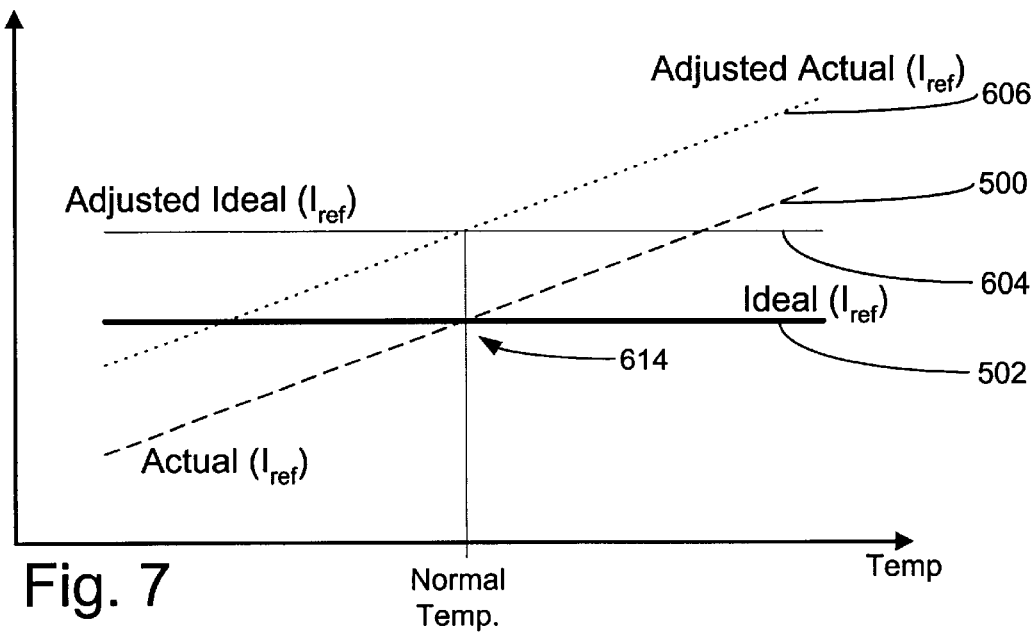
FIG. 7 is the plot of FIG. 6 and further includes an exemplary plot of adjusted ideal reference current and adjusted actual reference current over a temperature range in the amplifier system.

FIG. 7 is the example plot of FIG. 6 with the additional plot of the adjusted ideal reference current 604 and the adjusted actual reference current 606. The adjusted ideal reference current 604 comprises the ideal reference current 502 that has been adjusted upward to compensate for the effects of the compensation module shown in FIG. 3. Likewise, the adjusted actual reference current 606 comprises the actual reference current 500, still affected by variation over a temperature range, but increased by a quantity to compensate for the current draw through the compensation module. The adjusted actual current 606 is the current $I_{ref}$ Shown in FIG. 3. $I_{ref}$ may be adjusted by varying the value of resistor 210. At normal operating temperatures, the current passing through the compensation module is deducted from the adjusted actual current 606 to direct the same current at normal temperature to the current mirror bias circuit as would be directed had the current levels not been adjusted upward. The desired current value at normal temperature is at point 614 on FIG. 7. In one embodiment this upward adjustment, or offset, is equal to the bias current for the temperature compensation module.

Figure 8:
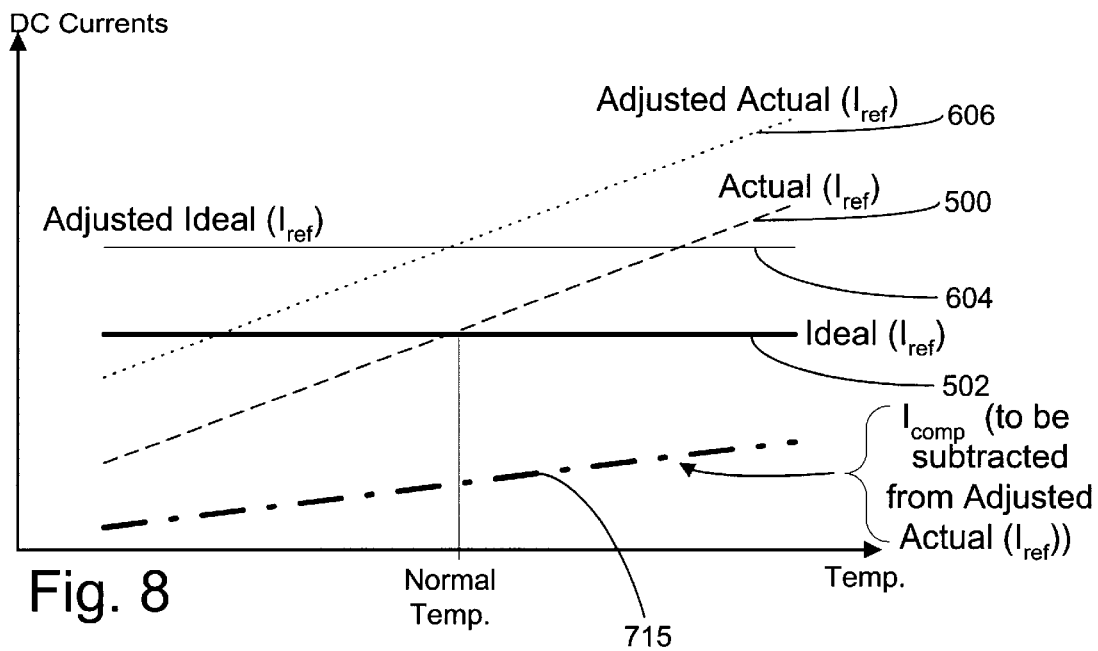
FIG. 8 is the plot of FIG. 7 and further includes a plot of a compensation current value over a temperature range to be subtracted from the adjusted actual reference current in the amplifier system.

FIG. 8 is the plot of FIG. 7 with the additional plot of a compensation module current 715 ($I_{comp}$) versus temperature that flows through the compensation module. The compensation module current 715 also varies over temperature ranges. Thus, the compensation module current 715 is greater at higher temperatures than at lower temperatures. The slope of the compensation module current 715 over a temperature range differs from the slope of the actual reference current 500 over the same temperature range.

Figure 9:
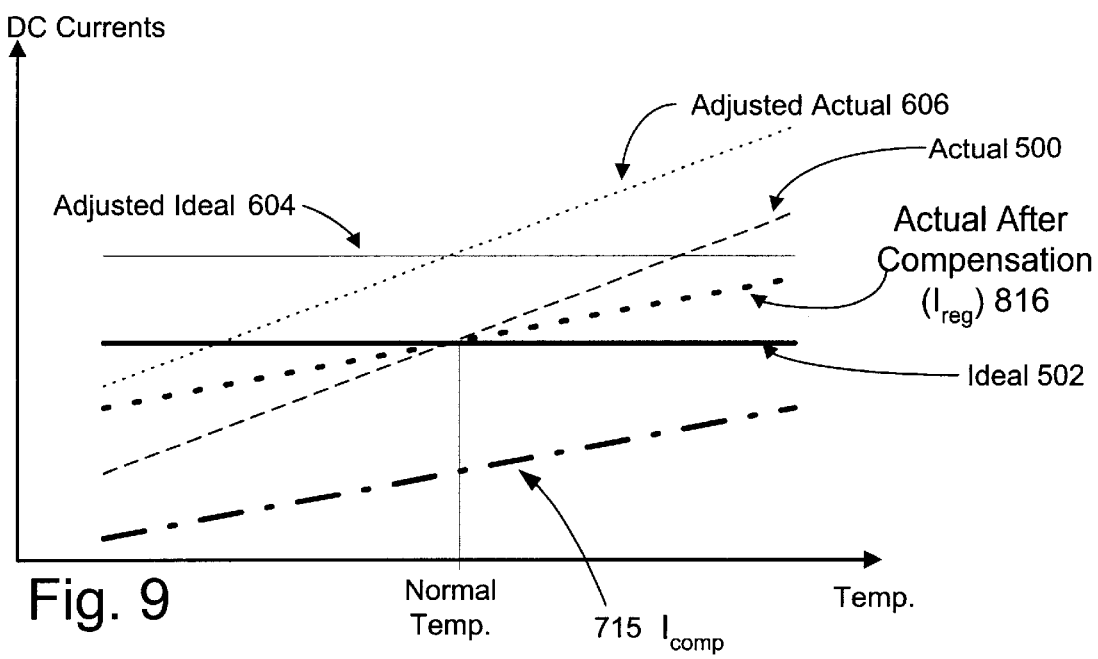
FIG. 9 is the plot of FIG. 8 and further includes a plot of actual reference current after compensation over the temperature range in the amplifier system.

FIG. 9 is the plot of FIG. 8 with the additional plot of regulator current after compensation 816 over temperature in an exemplary amplifier system. The regulator current after compensation 816 over temperature is defined by the following equation:

$$I_{regulator} = I_{ref} - I_{compensation}$$

At normal operating temperatures, the compensation current ($I_{comp}$) 715 subtracts from the adjusted actual current 606 ($I_{ref}$) to cause the actual $I_{reg}$ current after compensation 816 to assume a value that is generally identical to the actual current 500 before compensation and the ideal current 502 before compensation. Thus, at normal temperature the compensation current 715, being subtracted from the adjusted actual 606 negates the effects of adjusting the current upward.

For a low temperature situation, the compensation module draws current from the reference current ($I_{ref}$) (FIG. 3). However, at low temperature the amount of current flowing through the compensation module is minimal. Because minimal current is flowing through the compensation module, the majority of the current flows to the regulator. Hence, at low temperature conditions, the compensation module has a lesser effect on the system. As a result of the reference current being increased, the actual current after compensation or regulator current is thus closer to ideal current 502.

With regards to a high temperature situation, the impact of the semiconductors in the regulator causes the regulator current to increase. This is undesirable because the variance is mirrored at the output. To counteract the consequence of increased temperature, the compensation module draws more current as compared to operation in a low temperature environment. Thus, as the temperature increases the compensation module draws more current. As temperature increases, the increased flow of compensation current 715 counteracts the increase in the adjusted actual current 606, i.e. reference current, to maintain the actual current after compensation 816 ($I_{reg}$) closer to the ideal current 502 in the regulator.

In another embodiment, such desirable operation occurs because the current through the compensation module varies over a temperature range. In this manner, the current flowing through the compensation module offsets the temperature variation in reference current.

Figure 10:
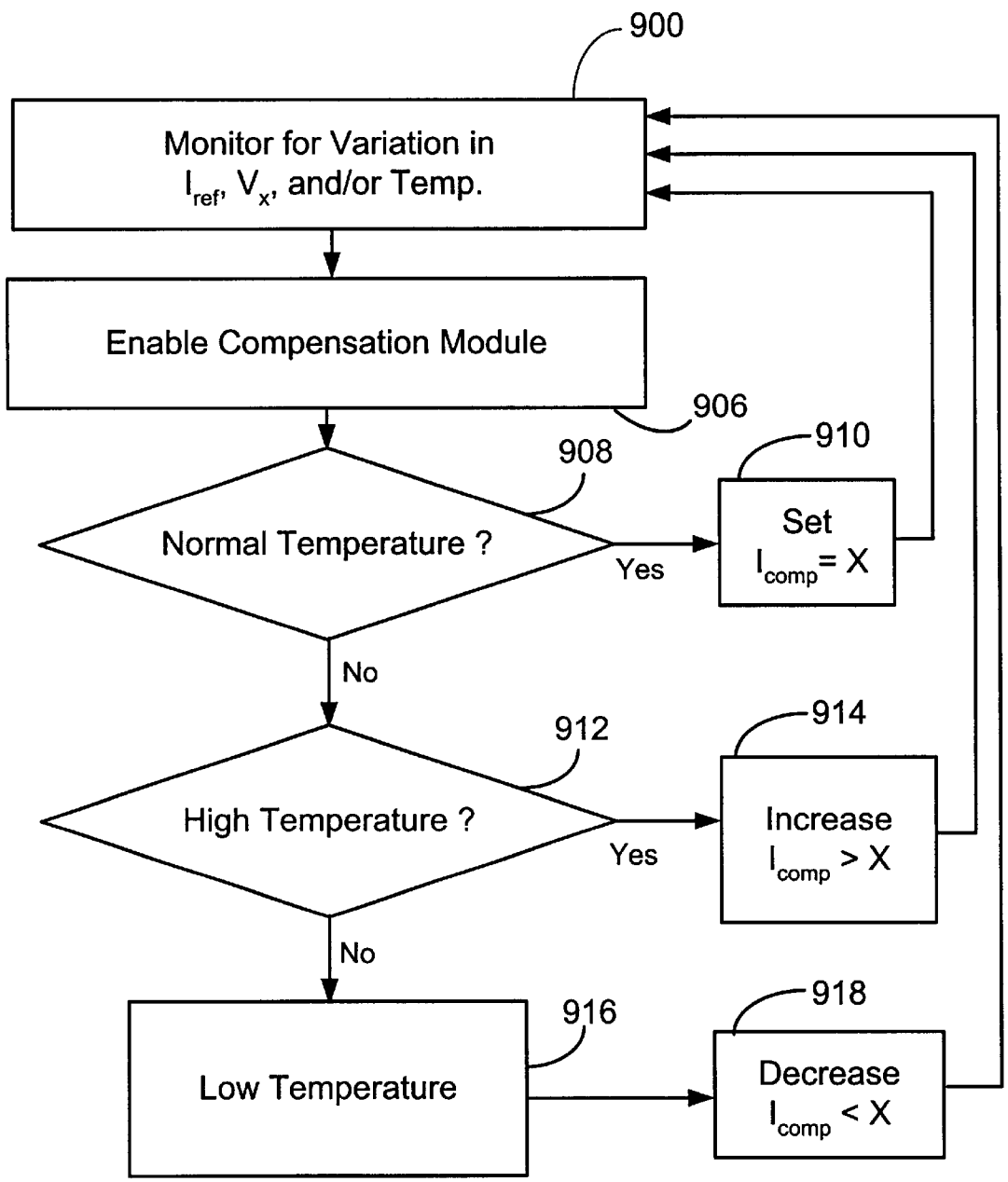
FIG. 10 is a flow chart of a method of operation of the invention.

FIG. 10 illustrates a flow chart of a method of operation of the invention. Please note, other methods of operation are possible. The method shown in FIG. is associated with a device having a monitoring apparatus configured to monitor $I_{ref}$, $V_X$, and/or temperature. In other embodiments, such as that provided in FIG. 4, the temperature compensation occurs automatically. At a step 900, the operation monitors for a variation in the reference current ($I_{ref}$), Vx, and/or temperature. Such variations occur in a semiconductor device for various reasons. At a step 906, in response to a variation in $I_{ref}$, $V_X$, and/or temperature, the operation enables the compensation module. In other embodiments the compensation module may be configured to operate continuously.

Once the compensation module is enabled or active, a determination is made regarding the temperature of the environment or circuit. Hence, at a decision step 908, the operation evaluates the temperature against a range of temperatures considered to be normal. In one embodiment X is a value selected with knowledge of the operation of the compensation module. It is anticipated that the increase in reference current can occur as a result of $I_{ref}$ variation or an amplifier system may be permanently configured with a larger $I_{ref}$ at the time of design.

If the system is operating in a normal temperature environment, the operation progresses to a step 910 where the compensation module sets $I_{comp}$ equal to X. Setting $I_{comp}$ equal to X decreases $I_{reg}$ by a value X. As a result, it may be necessary to increase $I_{ref}$ at the time of design to-cause $I_{reg}$ to be a desired amount at normal temperature.

If at decision step 908 the temperature environment is not within the normal temperature range, the operation progresses to a decision step 912. At decision step 912, the operation determines if the system is operating in a high temperature environment. If the temperature environment is determined to be a high temperature environment, then the operation progresses to a step 914 where the compensation module increases the compensation current by a value greater than X. Increasing the compensation current by this value reduces the current in the regulator of FIG. 3. This compensates for periods of high temperature operation of the system and offsets the increase in $I_{reg}$ that would otherwise occur from the temperature increase. The value of X by which the compensation module increases the compensation current may be variable to account for the non-discrete variance in reference current over temperature.

Alternatively, if at decision step 912 the system is not operating in a high temperature environment, the operation progresses to a step 916. At step 916, the operation determines that the system is operating in a low temperature environment. Because operation is occurring in a low temperature environment the operation advances to a step 918, and the compensation module decreases the compensation current, $I_{comp}$ to a value less than X. This offsets the decrease in $I_{reg}$ that would otherwise occur due to the temperature change. The value of X by which the compensation module increases or decreases the compensation current may be variable to account for the non-discrete variance in reference current over temperature. Of course, this is but one possible method of operation.

In other embodiments, the above-described operation advantageously occurs automatically and in non-discreet, more continuous fashion. Further, in these embodiments the compensation module is continually enabled. While such continual operation of the compensation module draws additional power from the unit, the overall affect is a net power savings because in a device incorporating the compensation module the extra current use is negligible due to the N:1 ratio. Additionally, the amplifier design can be optimized for more efficiency with less linearity margin since less margin is needed over a typical temperature range. It is further contemplated that the compensation module will provide benefit to any type of system using transistors. Systems that will benefit from the advantages of the invention include, and are not limited to, power amplifiers and any gain stages employing suitable bias networks.

Figure 11:
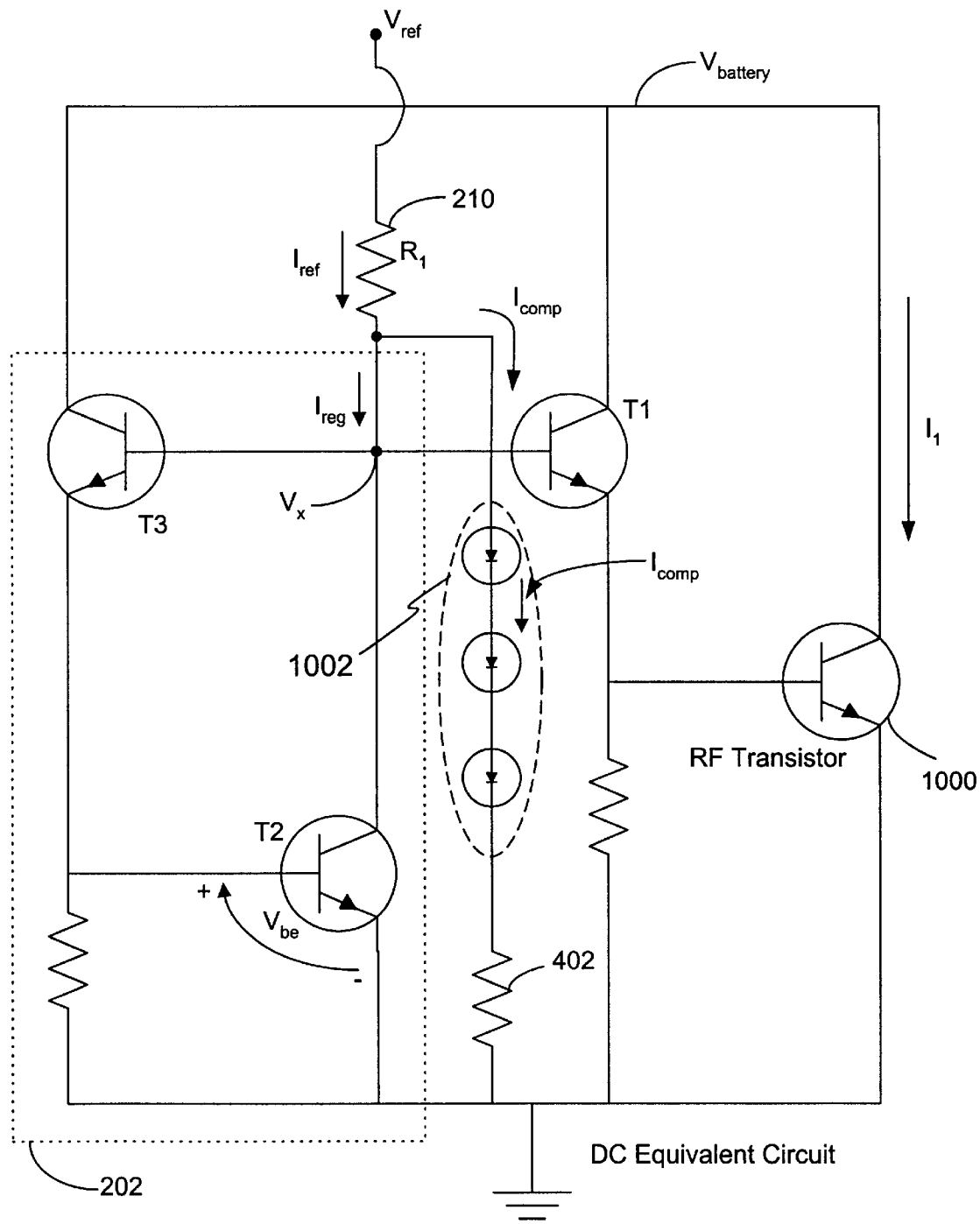
FIG. 11 is circuit diagram of an implementation example including compensation circuitry.

FIG. 11 illustrates an implementation example of the invention in the form of a DC equivalent circuit of a current mirror configuration. The implementation example shown comprises a current mirror configuration paired to a radio frequency transistor amplifier 1000. Such a system is well suited for use in wireless communication devices such as a wireless telephone or radio.

As shown, a pair of transistors T1 and T3 form a current mirror. Transistor T2 operates in unison with transistor T3 to regulate the voltage $V_X$. Voltage $V_X$ is determined in part by resistor value 210, as $I_{ref}$ flows through the resistor. Plaguing such designs in the past, voltage $V_X$ varies as temperature varies and can be generally defined to cause $I_{ref}$ to increase as temperature increases and decrease as temperature decreases. Variance in the reference current disrupts the bias of the RF transistor 1000. Disruption of the RF transistor 1000 bias undesirably hinders performance of the system. If the current mirror multiplication level is set to greater than unity, i.e. 1, then the variance in $I_{reg}$ is multiplied by a factor of N at $I_l$.

The changes in operating behavior over temperature of transistors T1 and T2 cause voltage VX to also vary over temperature. Changes in $V_X$ alter $I_{ref}$. In the configuration shown in FIG. 11 there are two semiconductor devices of interest, namely T1 and T2. To insure that the current drawn by the compensation module varies more greatly over the operating temperature range than the variance in current $I_{ref}$ caused by transistors T1 and T2, the compensation module includes three diodes 1002. In the embodiments shown in FIG. 11, the three diodes 1002 comprise Schottky diodes having about a 0.7 volt drop at normal temperature. Because there are three semiconductor junctions working as diodes 1002 in the compensation module, the module is able to compensate the variation of the two devices T1 and T2. Thus, the compensation module draws greater current at high temperature than at low temperature. This deduction in current from the regulator devices desirably reduces the amount of variation that is mirrored at the output. Thus, the bias condition of the RF transistor is more accurately maintained.

While various embodiments of the application have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A bias system including a current mirror and a radio frequency transistor, the current mirror having a temperature compensation module to compensate for changes in current mirror reference current that occur over a temperature range comprising:

a reference voltage node;

a current mirror comprising:

a first transistor having a base, a collector and an emitter;

a second transistor having a base, a collector and an emitter, wherein the base of the first transistor connects to the base of the second transistor at a base node;

a resistor having a first terminal connected to the reference voltage node and a second terminal connected to the base node;

a third transistor having a base, a collector, and an emitter, wherein the collector of the third transistor connects to the base node, and wherein the base of the third transistor connects to the emitter of the first transistor; and a compensation module connected to the base node, the compensation module configured to selectively draw current from the base node in response to temperature changes.

2. The bias system of claim 1, further including a radio frequency transistor having a base, a collector, and an emitter, where the base of the radio frequency transistor connects to the emitter of the second transistor.

3. The bias system of claim 1, wherein the compensation module comprises at least one semiconductor device.

4. The bias system of claim 1, wherein the compensation module comprises three series connected diodes in series connection with a compensation module resistor.

5. The bias system of claim 1, wherein the reference voltage node obtains voltage from a battery.

6. The bias system of claim 1, wherein the current mirror is in cascode configuration.

7. A temperature compensation module configured to compensate for temperature changes to thereby reduce variation of an output current by adjusting a regulator current, the regulator current flowing through a first path to ground, the module comprising:

at least two series connected diodes; and at least one resistor, the resistor connected in series with the at least two series connected diodes, wherein the at least two series connected diodes and the at least one resistor form a second current path to conduct the portion of a reference current to ground.

8. The module of claim 7, wherein at least one of the diodes comprises a Schottky diode.

9. The module of claim 7, wherein at least one of the diodes comprises a transistor.

10. The module of claim 7, wherein the regulator current flows through a current mirror connected to the compensation module, the compensation module configured to reduce DC bias current variation over the operating temperature of a RF transistor.

11. The module of claim 7, wherein the module utilizes three series connected Schottky diodes.

12. A current divider network for use in conjunction with a bias circuit, the network configured to reduce a regulator current by conducting current away from a regulator comprising:

a number of semiconductor devices configured to reduce the regulator current by conducting current from the regulator to a ground node; and at least one resistor connected to at least one of the number of semiconductor devices, wherein at least one of the semiconductor devices or at least one of the resistors is connected to ground and wherein the semiconductor devices and the at least one resistor are configured in parallel to the regulator.

13. The current divider network of claim 12, wherein the number of semiconductor devices is greater than the number of semiconductor devices in the bias circuit.

14. The network of claim 12, wherein the semiconductor devices comprise one or more external diodes.

15. The network of claim 12, wherein the number of semiconductor devices and the at least one resistor are connected in series.

16. The network of claim 12, wherein the bias circuit controls the bias of a radio frequency transistor.

17. The network of claim 12, wherein the number of semiconductor devices comprises three diodes.

18. The network of claim 12, wherein the bias circuit comprises a current mirror.

19. A temperature compensation system to compensate for the effects of temperature variation between a high temperature and a low temperature as compared to a normal temperature on one or more semiconductor devices comprising:

means for conducting current away from the one or more semiconductor devices to thereby reduce the current flowing through the one or more semiconductor devices; and means for controlling current flow in the means for conducting wherein the means for controlling reduces variation in current flow through the one or more semiconductor devices as the temperature changes by controlling the amount of current conducted away from the one or more semiconductor devices as temperature changes.

20. The system of claim 19, wherein the means for controlling comprise a semiconductor device.

21. The system of claim 19, wherein the means for controlling conducts more current away, as compared to current flow at normal temperature, from the one or more semiconductor devices as temperature increases and conducts less current away, as compared to current flow at normal temperature, from the one or more semiconductor devices as temperature decreases.

22. A temperature compensation method to compensate for the effects of temperature changes on semiconductor devices, the method utilizing a compensation module to compensate for current flow comprising:

connecting the compensation module to a current supply node for one or more semiconductor devices, wherein increasing the current draw of the compensation module decreases the current supplied to the one or more semiconductor devices;

increasing the amount of current supplied from a current source to the one or more semiconductor devices at a normal temperature to compensate for the current draw of the compensation module at normal temperature;

increasing the current draw of the compensation module at temperatures above normal temperature to compensate for the effect of temperature on the one or more semiconductor devices; and decreasing the current draw of the compensation module at temperatures below normal temperature to compensate for the effect of temperature on the one or more semiconductor devices.

23. The method of claim 22, wherein the one or more semiconductor devices are configured as a current mirror.

24. The method of claim 22, wherein the compensation module comprises at least one diode.

25. The method of claim 22, wherein the compensation module comprises one or more semiconductors and one or more resistors.

26. The method of claim 22, wherein the method is utilized to control the variation in reference current in a current mirror, the reference current being mirrored to control the bias of a radio frequency transistor.

* * * * *